United States Patent
Park et al.

(10) Patent No.: US 7,842,539 B2
(45) Date of Patent: Nov. 30, 2010

(54) ZINC OXIDE SEMICONDUCTOR AND METHOD OF MANUFACTURING THE SAME

(75) Inventors: Seong Ju Park, Gwangju (KR); Min Suk Oh, Gwangju (KR); Dae Kyu Hwang, Gwangju (KR); Min Ki Kwon, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 80 days.

(21) Appl. No.: 12/145,371

(22) Filed: Jun. 24, 2008

(65) Prior Publication Data

US 2009/0001363 A1    Jan. 1, 2009

(30) Foreign Application Priority Data

Jun. 26, 2007    (KR) .................. 10-2007-0063270

(51) Int. Cl.
  *H01L 21/00* (2006.01)
(52) U.S. Cl. .................. 438/104; 438/85; 438/768; 438/903; 257/E21.211; 257/E21.459; 257/E21.497
(58) Field of Classification Search .................. 438/85, 438/768, 903; 257/E21.386, E21.398, E21.459, 257/E21.477, E21.482, E21.497, E21.603
  See application file for complete search history.

(56) References Cited

U.S. PATENT DOCUMENTS

2004/0175860 A1* 9/2004 Park et al. .................. 438/104
2007/0028959 A1* 2/2007 Lee et al. .................. 136/252

OTHER PUBLICATIONS

Kyoung-Kook Kim, et al., "Realization of p-type ZnO thin films via phosphorus doping and thermal activation of the dopant", Applied Physics Letters, vol. 83, No. 1, Jul. 7, 2003, pp. 63-65.

* cited by examiner

*Primary Examiner*—Walter L Lindsay, Jr.
*Assistant Examiner*—Cheung Lee

(57) ABSTRACT

There are provided a method of manufacturing a zinc oxide semiconductor, and a zinc oxide semiconductor manufactured using the method. A metal catalyst layer is formed on a zinc oxide thin film that has an electrical characteristic of a n-type semiconductor, and a heat treatment is performed thereon so that the zinc oxide thin film is modified into a zinc oxide thin film having an electrical characteristic of a p-type semiconductor. Hydrogen atoms existing in the zinc oxide thin film are removed by a metal catalyst during the heat treatment. Accordingly, the hydrogen atoms existing in the zinc oxide thin film are removed by the metal catalyst and the heat treatment, and the concentration of holes serving as carriers is increased. That is, an n-type zinc oxide thin film is modified into a highly-concentrated p-type zinc oxide semiconductor.

7 Claims, 3 Drawing Sheets

[FIG. 1]
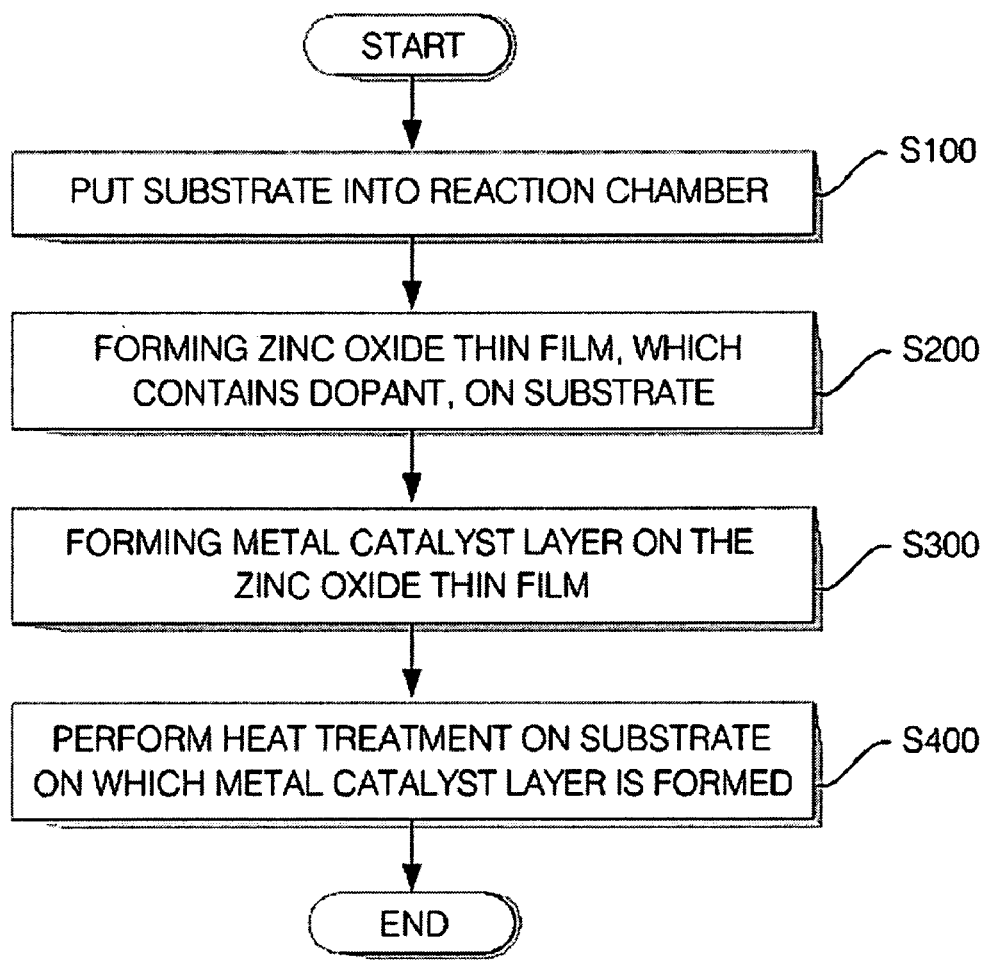
[FIG. 2]
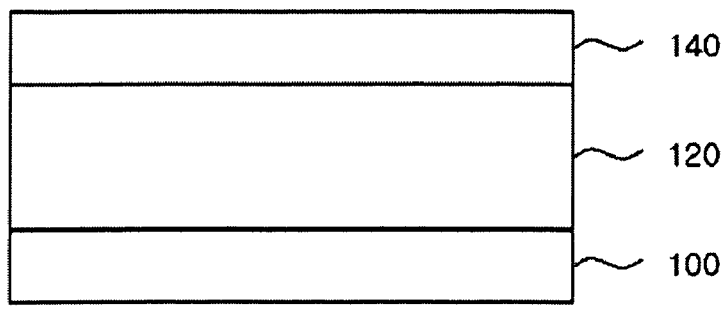

[FIG. 3]
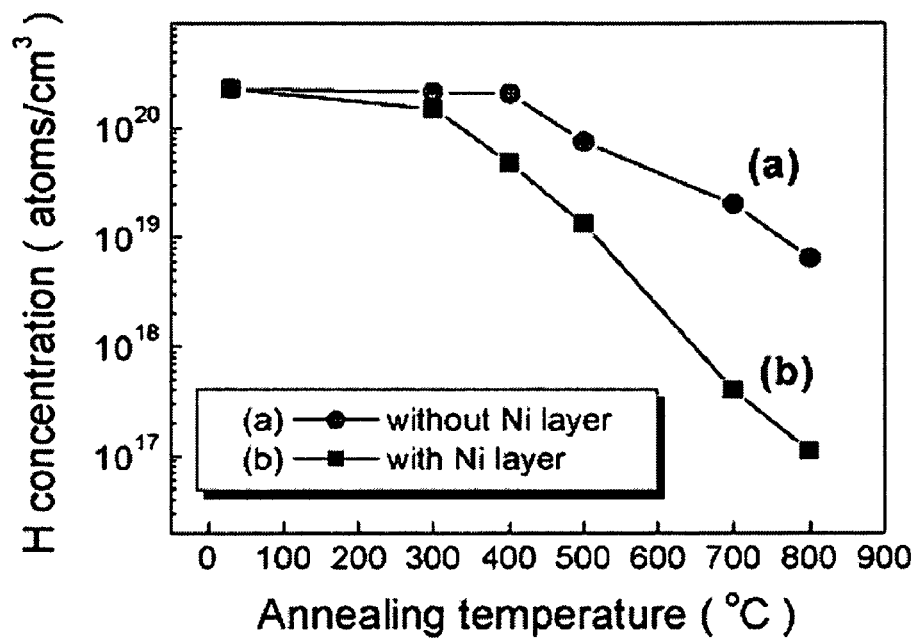
[FIG. 4]
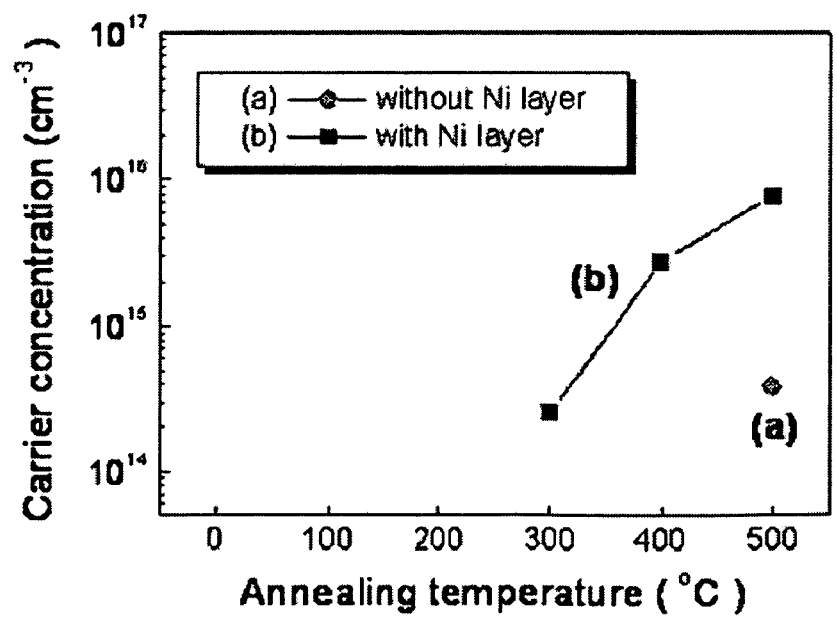

[FIG. 5]
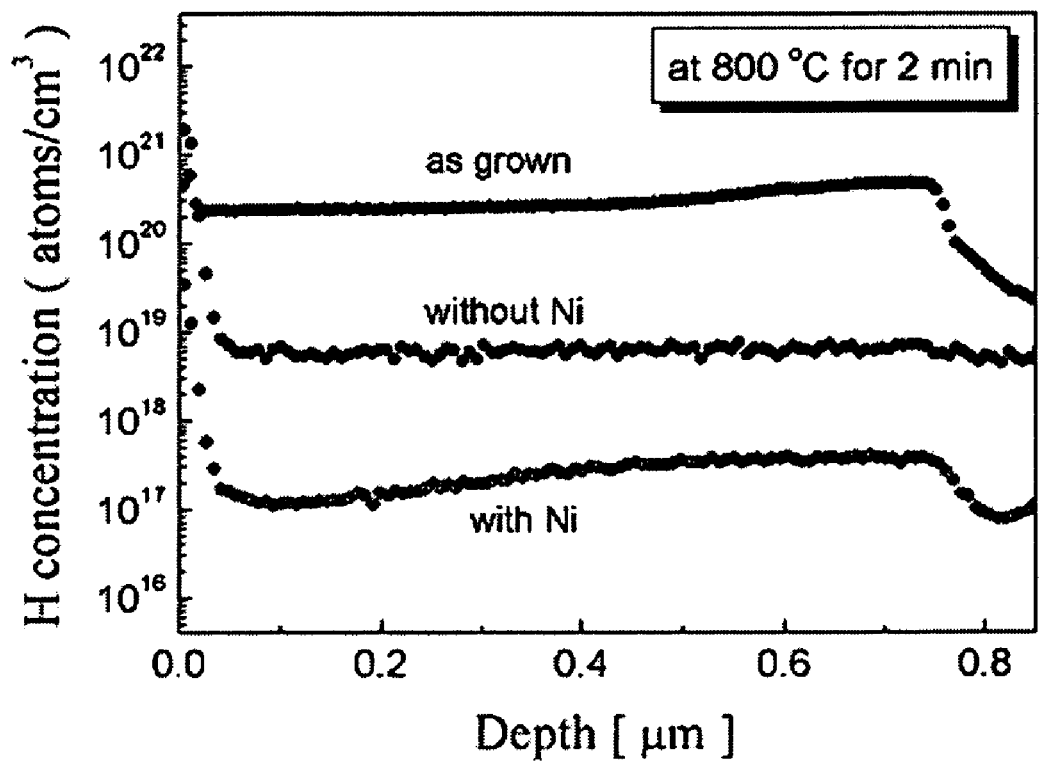

ZINC OXIDE SEMICONDUCTOR AND METHOD OF MANUFACTURING THE SAME

BACKGROUND OF THE INVENTION

1. Field of the Invention

The present invention relates to a zinc oxide semiconductor, and more particularly, to a method of manufacturing a p-type zinc oxide semiconductor and a p-type zinc oxide semiconductor manufactured using the method.

2. Description of the Related Art

A zinc oxide semiconductor is a group II-VI semiconductor, and has the hexagonal wurzite structure. The zinc oxide semiconductor has the structure similar to the structure of a GaN-based material that is currently used in a light emitting device, and many researches have been performed on the zinc oxide semiconductor as a light source at home and abroad.

In particular, a zinc oxide semiconductor has an optical band gap of 3.37 eV at a normal temperature, and may be used as a light source in a near ultraviolet region, which makes it possible to allow a blue light emitting device to be used as a light source using a white light emitting diode. Further, an exciton bonding energy of the zinc oxide semiconductor at the normal temperature is larger than that of GaN at the normal temperature. Therefore, when the zinc oxide semiconductor is used in a field of a photoelectric device using an exciton, it is possible to expect a high optical gain. In addition, since having excellent conductivity and transparency, the zinc oxide semiconductor has been applied to various photoelectric devices, such as a transparent electrode, a sound acoustic wave device, and a varistor device.

However, the zinc oxide semiconductor is not evaporated stoichiometrically in an actual process for forming a thin film, and has the characteristic of an n-type type semiconductor due to the surplus of zinc or the lack of oxygen. The research on the manufacture of an n-type zinc oxide semiconductor has been developed heretofore, but the manufacture of a p-type zinc oxide semiconductor essential for a photoelectric device or a photoelectric device is not completely successful.

A photoelectric device emits light corresponding to an energy generated while a hole and an electron are necessarily combined with each other. Further, since a channel is formed of a hole in the case of a p-type thin film transistor, a good p-type thin film transistor should be manufactured in order to manufacture the above-mentioned electronic devices.

The reason why the p-type zinc oxide semiconductor thin film is difficult to be manufactured is that the solubility of group I and V elements for forming holes is very low in the zinc oxide. Further, hydrogen adulterated during the growth of the thin film forms a dopant-H(hydrogen) or O(oxygen)-H(hydrogen) complex body, and provides electrons into the thin film, so that holes are compensated. Therefore, there is a problem in that it is difficult to form holes in the thin film [C. G. Van de Walle et al, Nature 423, 626(2003)].

There have been the following methods of manufacturing a p-type zinc oxide semiconductor thin film that have been reported heretofore by various groups.

Japanese Yamamoto group [T. Yamamoto et al, Jpn. J. Appl. Phys. Part 2 38, L166(1999)] theoretically proposed that a p-type zinc oxide semiconductor can be manufactured using a method of simultaneously doping N (group V element) and Ga or Al (group III element).

Further, M. Joseph group [M. Joseph et al, Jpn. J. Appl. Phys. Part 2 38, L1205(1999)] manufactured a p-type zinc oxide semiconductor thin film having a carrier concentration of $4 \times 10^{19}/cm^3$ by using Ga (group III element) and N (group V element). However, it was reported that the reproducibility of these doping methods was very low, and these doping methods were not recognized as a stable and reliable method of manufacturing a p-type zinc oxide semiconductor.

T. Aoki group [T. Aoki et al. Appl. Phys. Lett. 76, 3257 (2000)] reported a method of manufacturing a p-type zinc oxide semiconductor by evaporating $Zn_3P_2$ with an electron beam, and then performing a heat treatment with laser, as another method. However, it was reported that the measurement using a Hall effect for evaluating an electrical characteristic failed.

Y. R. Ryu group [Y. R. Ryu et al, J. Crystal Growth 216, 330(2000)] reported a method of manufacturing a p-type zinc oxide thin film doped with As (group V element), as another method. Further, a method of manufacturing a p-type zinc oxide semiconductor thin film, which dopes nitrogen known as an optimum dopant, has been reported in recent years [D. C. Look, Appl. Phys. Lett. 81, 1830(2002)]. However, it has been known that a semiconductor thin film having an electrical characteristic of a p-type semiconductor is changed into a semiconductor thin film having an electrical characteristic of an n-type semiconductor or an insulator, as time goes by, that is, the reliability of this method is low.

Furthermore, K. K. Kim group [K. K. Kim et al, Appl. Phys. Lett. 83, 63(2003)] reported a method of manufacturing a p-type zinc oxide semiconductor thin film by doping phosphorus ($P_2O_5$) and quickly performing a heat treatment under nitrogen atmosphere at a high temperature of 800° C. or more. However, oxygen cavities are generated on the surface of the p-type zinc oxide thin film due to the heat treatment that is quickly performed at a high temperature of 800° C. or more, so that surface fracture may occur.

In addition, Japanese Unexamined Patent Application Publication No. 2000-244014 discloses a technology for forming a buffer layer below a light emitting layer using metal. Japanese Unexamined Patent Application Publication No. 2002-16088 discloses a technology for activating a p-type dopant by performing annealing at a temperature of 450° C. or more. Further, Korean Patent Application Publication No. 2002-77557 discloses a technology that uses a quick heat treatment process in order to activate a p-type dopant, and Korean Patent Application Publication No. 2007-22991 discloses a technology that uses copper as a p-type dopant and performs a heat treatment thereon.

However, the technologies disclosed in the above-mentioned Patent Application Publications have limitation on manufacturing a highly-concentrated p-type zinc oxide thin film. That is, the technologies recover merely a part of defects in the thin film and have limitation on obtaining an electrical characteristic of a highly-concentrated p-type semiconductor by completely activating a dopant.

SUMMARY OF THE INVENTION

A first object of the present invention, which solves the above-mentioned problems, is to provide a method of manufacturing a p-type zinc oxide semiconductor.

Further, a second object of the present invention is to provide a p-type zinc oxide semiconductor obtained from the first object.

In order to achieve the first object, according to an embodiment of the present invention, a method of manufacturing a p-type zinc oxide semiconductor includes forming a zinc oxide thin film, which contains a group I or V element, on a substrate; forming a metal catalyst layer on the zinc oxide thin film; and changing the zinc oxide thin film into a zinc oxide semiconductor, which has an electrical characteristic of a p-type semiconductor, by performing a heat treatment on the substrate on which the metal catalyst layer is formed.

In order to achieve the second object, according to another embodiment of the present invention, a zinc oxide semiconductor is modified so that hydrogen atoms existing in a zinc oxide thin film are removed and an n-type zinc oxide thin film has an electrical characteristic of a p-type semiconductor by using forming a zinc oxide thin film, which contains a group I or V element, on a substrate; forming a metal catalyst layer on the zinc oxide thin film; and performing a heat treatment on the substrate on which the metal catalyst layer is formed.

BRIEF DESCRIPTION OF THE DRAWINGS

FIG. 1 is a flowchart illustrating a method of manufacturing a p-type zinc oxide semiconductor thin film according to a preferred embodiment of the present invention;

FIG. 2 is a cross-sectional view of a p-type zinc oxide semiconductor according to a preferred embodiment of the present invention;

FIG. 3 is a graph showing that hydrogen concentration of a zinc oxide thin film is changed in accordance with heat treatment temperature when a metal catalyst layer is used;

FIG. 4 is a graph showing how many carriers exist in the zinc oxide thin film when a heat treatment is performed while temperature is changed; and FIG. 5 is a graph showing the hydrogen concentration in accordance with the depth of the zinc oxide thin film according to the embodiment of the present invention.

DESCRIPTION OF THE PREFERRED EMBODIMENTS

Since the present invention can be changed in various ways and include various embodiments, specific embodiments are illustrated in the drawings and will be described in detail. However, the present invention is not limited to the specific embodiments, and the scope of the present invention is defined by the appended claims rather than by the description preceding them, and all changes and modifications that fall within meets and bounds of the claims, or equivalences of such meets and bounds are therefore intended to be embraced by the claims. Like reference numerals refer to like elements throughout the specification.

It will be understood that when an element is referred to as being "on" or "below" another element, it can be directly on another element or intervening elements may be present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As long as being not specially defined, all terms (including technical and scientific terms) used in the context of describing the invention may be commonly understood to those skilled in the art as the same meaning as the general meanings. The terms defined in a general dictionary are should be interpreted as the same meaning as described in the related art. Further, as long as being not specially defined in this specification, the terms are not ideally or exaggeratedly interpreted.

Preferred embodiments of the present invention will be described in detail below with reference to accompanying drawings.

FIG. 1 is a flowchart illustrating a method of manufacturing a p-type zinc oxide semiconductor thin film according to a preferred embodiment of the present invention.

FIG. 2 is a cross-sectional view of a p-type zinc oxide semiconductor according to a preferred embodiment of the present invention.

Referring to FIGS. 1 and 2, a substrate 100 is put into a reaction chamber (S100). A silicon substrate, a sapphire substrate, a zinc oxide substrate, a flexible polymer substrate, a glass substrate, or a glass substrate on which a transparent conductive oxide is evaporated may be used as the substrate 100.

Then, a zinc oxide thin film 120 containing a group I or V element is formed (S200). A group I element, a group V element, or the oxide of a group V element is used as a dopant in order to form the zinc oxide thin film 120. For example, the zinc oxide thin film 120 may be formed by an RF or DC magnetron sputtering method or a pulse laser evaporation method while a solid zinc oxide containing 0.001 to 40% by weight of a phosphorus oxide ($P_2O_5$) is used as a target. Further, when a thin film is formed using a source in a plasma state, it is possible to improve the reactivity between a group V element or the oxide of a group V element and a zinc oxide. Therefore, it is possible to increase the amount of the group V element or the oxide thereof that is implanted into the formed zinc oxide thin film 120. As a result, it is possible to improve the doping effect.

Subsequently, a metal catalyst layer 140 is formed on the zinc oxide thin film 120 containing the dopant (S300). The metal catalyst layer 140 is made of at least one selected from Ni, Au, Pt, Pb, Mg, Cu, Zn, Ag, Sc, Co, Rh, Li, Be, Ca, Ru, Ti, Ta, Na, and La, or an alloy thereof. Further, the metal catalyst layer 140 may have a multilayered structure.

It is preferable that the thickness of the metal catalyst layer 140 be in the range of 0.1 to 1000 nm.

Further, it is preferable that the metal catalyst layer 140 be formed by an electron beam evaporator (e-beam evaporator), a thermal evaporator, a sputtering evaporator, or a pulse laser evaporator.

After that, a heat treatment is performed on the substrate 100 where the metal catalyst layer 140 is formed, so that hydrogen atoms are removed from the zinc oxide thin film 120 and the dopant is activated (S400). The heat treatment performed on the substrate 100 may be performed in-situ in the chamber for forming the zinc oxide thin film 120, or may be performed in a separate chamber. The group I or V element contained in the zinc oxide thin film 120 is activated due to the heat treatment, and serves as a p-type dopant. In particular, the metal catalyst layer 140 formed on the zinc oxide thin film 120 makes a dopant-H and an O—H complex body, which are formed due to hydrogen that may be adulterated during the growth of the thin film, be effectively dissociated. Accordingly, the group I or V element is easily activated. It is preferable that the heat treatment be performed in a chamber having gas atmosphere including at least one of nitrogen, oxygen, air, and inert gas.

Further, the temperature in the chamber is maintained at 50 to 1500° C. for 1 second to 30 minutes so that the heat treatment is performed on the substrate 100 where the zinc oxide thin film 120 and the metal catalyst layer 140 are sequentially formed.

FIG. 3 is a graph showing that hydrogen concentration of a zinc oxide thin film is changed in accordance with heat treatment temperature when a metal catalyst layer is used.

Referring to FIG. 3, a zinc oxide thin film, which is doped with phosphorus or a phosphorus oxide, is formed on a sapphire substrate at a thin film growth temperature of 500° C. by the RF magnetron sputtering method by using a zinc oxide compound target containing 0.01% by weight of a phosphorus oxide ($P_2O_5$).

Subsequently, the substrate where the zinc oxide thin film is formed is put into the reaction chamber, and a Ni catalyst metal layer having a thickness of 10 nm is formed on the zinc oxide thin film by an electron beam evaporator.

The pressure in the chamber is maintained at a vacuum pressure of $7 \times 10^{-7}$ Torr in order to activate the p-type zinc oxide thin film that is formed by the above-mentioned method, and the hydrogen concentration of the zinc oxide thin film was measured while the temperature is changed from a normal temperature to 800° C.

Further, a zinc oxide thin film, which is doped with phosphorus or a phosphorus oxide, is formed under the same conditions as described above. Then, a semiconductor thin film without a Ni catalyst metal layer is formed, and a heat treatment is performed at the same vacuum pressure and temperature. After that, the hydrogen concentration of the zinc oxide thin film was measured.

It can be seen from FIG. 3 that the hydrogen concentration of the zinc oxide thin film is significantly decreased at a temperature of 300 to 400° C. if a Ni metal catalyst layer is formed. Accordingly, it can be seen that the hydrogen concentration of the zinc oxide thin film is rapidly decreased if the metal catalyst layer is formed and the heat treatment is performed.

FIG. 4 is a graph showing how many carriers exist in the zinc oxide thin film when a heat treatment is performed while temperature is changed.

Referring to FIG. 4, first, a zinc oxide thin film doped with phosphorus or a phosphorus oxide is formed, and a heat treatment is then performed at a temperature of a normal temperature to 500° C. It can be seen that hydrogen is not sufficiently diffused to the outside at a temperature lower than 300° C. regardless of the formation of the metal catalyst layer, so that the concentration of holes serving as carriers is very low. This is guessed due to a fact that few holes are generated by hydrogen existing in the zinc oxide thin film and a Hall effect for evaluating an electrical characteristic does not sufficiently occur. Accordingly, the doped zinc oxide thin film has a characteristic similar to that of an insulator in a heat treatment performed at a temperature lower than 300° C.

Further, when the zinc oxide thin film doped with phosphorus or a phosphorus oxide is formed and a heat treatment is then performed without forming a metal catalyst layer, it can be seen that the zinc oxide thin film has characteristics substantially similar to those of an insulator at a temperature of 500° C. or less regardless of heat treatment temperature.

However, when the zinc oxide thin film doped with phosphorus or a phosphorus oxide is formed and a metal catalyst layer made of Ni is then formed, the zinc oxide thin film has a hole concentration of $2.57 \times 10^{14}/cm^3$ at a heat treatment temperature of 300° C., that is, an electrical characteristic of a p-type semiconductor. Further, it can be seen that the zinc oxide thin film has a hole concentration of $7.61 \times 10^{15}/cm^3$ at a heat treatment temperature of 500° C., that is, an electrical characteristic of a highly-concentrated p-type semiconductor. Furthermore, when a metal catalyst layer is not formed on a zinc oxide thin film and a heat treatment is performed at about 500° C., it can be seen that the hole concentration is $3.8 \times 10^{14}/cm^3$. Comparing the two data, it can be seen that the zinc oxide thin film has a characteristic of a highly-concentrated p-type semiconductor due to the formed metal catalyst layer.

FIG. 5 is a graph showing the hydrogen concentration in accordance with the depth of the zinc oxide thin film according to the embodiment of the present invention.

Referring to FIG. 5, it can be seen that the hydrogen concentration in the zinc oxide thin film is significantly changed depending on whether the metal catalyst layer is formed or not.

That is, a sample (as grown) where a heat treatment is not performed on a zinc oxide thin film doped with phosphorus or a phosphorus oxide has a hydrogen concentration of about $2 \times 10^{20}/cm^3$ throughout the zinc oxide thin film. Further, when a heat treatment is performed on a zinc oxide thin film doped with phosphorus or a phosphorus oxide for 2 minutes at 800° C. without the formation of a metal catalyst layer, it can be seen that the hydrogen concentration is about $6 \times 10^{19}/cm^3$. Accordingly, it can be seen that the hydrogen concentration of the zinc oxide thin film is decreased to some extent due to a heat treatment.

Further, when a metal catalyst layer is formed on a zinc oxide thin film doped with phosphorus or a phosphorus oxide and a heat treatment is performed at 800° C. for 2 minutes, it can be seen that the hydrogen concentration of the thin film is significantly decreased throughout the thin film. That is, it can be seen that the concentration of the zinc oxide thin film is relatively constant regardless of depth and is about $1.5 \times 10^{17}/cm^3$.

As described above, when a metal catalyst layer is formed on a zinc oxide thin film having an electrical characteristic similar to that of an insulator and a heat treatment is performed, the formation of a dopant-H and an O—H complex body is prevented and a complex body formed by the chemical bond in the thin film is decomposed. Further, the zinc oxide thin film is changed into a zinc oxide thin film, which has an electrical characteristic of a p-type semiconductor, by activating a dopant. Accordingly, the zinc oxide thin film has higher carrier concentration by forming a metal catalyst layer, and is formed as a p-type zinc oxide semiconductor.

According to the present invention, a zinc oxide thin film, which has an electrical characteristic of an n-type semiconductor or an electrical characteristic of an insulator, is easily changed into a zinc oxide thin film, which has an electrical characteristic of an p-type semiconductor, by a metal catalyst layer and a heat treatment. Therefore, it is possible to generate and provide holes that are essential for a photoelectric device and an electronic device, so that it is possible to develop a photoelectric device and an electronic device, such as a light emitting diode, a laser diode, and a p-type transparent thin film transistor.

Although the present invention has been described in connection with the preferred embodiments of the present invention, it will be apparent to those skilled in the art that various modifications and changes may be made thereto without departing from the scope and spirit of the invention.

What is claimed is:

1. A method of manufacturing a p-type zinc oxide semiconductor, the method comprising:
    forming a zinc oxide thin film containing a group I or V element over a substrate;
    forming a metal catalyst layer over the zinc oxide thin film; and
    converting the zinc oxide thin film into a zinc oxide semiconductor having an electrical characteristic of a p-type semiconductor by heat treating the substrate and the metal catalyst layer at a temperature between 400 to 800° C.,
    wherein the metal catalyst layer is formed directly on the zinc oxide thin film.

2. The method according to claim 1, wherein the metal catalyst layer includes any of Ni, Au, Pt, Pb, Mg, Cu, Zn, Ag, Sc, Co, Rh, Li, Be, Ca, Ru, Ti, Ta, Na, and La, an alloy thereof, and a combination thereof.

3. The method of claim 1, wherein the heat treatment is performed in a chamber having gas atmosphere including any of nitrogen, oxygen, air, inert gas, and a combination thereof.

4. A p-type zinc oxide semiconductor made by:
forming a zinc oxide thin film containing a group I or V element over a substrate;
forming a metal catalyst layer over the zinc oxide thin film; and
heat treating the substrate and the metal catalyst layer at a temperature between 400 to 800° C. to convert the zinc oxide thin film into a zinc oxide semiconductor having an electrical characteristic of a p-type semiconductor,
wherein the metal catalyst layer is formed directly on the zinc oxide thin film.

5. The zinc oxide semiconductor according to claim 4, wherein the metal catalyst layer includes any of Ni, Au, Pt, Pb, Mg, Cu, Zn, Ag, Sc, Co, Rh, Li, Be, Ca, Ru, Ti, Ta, Na, and La, an alloy thereof, and a combination thereof.

6. The zinc oxide semiconductor according to claim 4, wherein the heat treatment is performed in a chamber having gas atmosphere including any of nitrogen, oxygen, air, inert gas, and a combination thereof.

7. A method of manufacturing a p-type zinc oxide semiconductor, the method comprising:
forming a zinc oxide thin film containing a group I or V element over a substrate;
forming a metal catalyst layer over the zinc oxide thin film; and
heat treating the metal catalyst layer to convert the zinc oxide thin film into a p-type zinc oxide semiconductor,
wherein the metal catalyst layer is formed directly on the zinc oxide thin film.

* * * * *